(12) United States Patent
Lee

(10) Patent No.: US 10,431,548 B2
(45) Date of Patent: Oct. 1, 2019

(54) ELECTRONIC COMPONENT MODULE AND METHOD OF MANUFACTURING THE SAME

(71) Applicant: SAMSUNG ELECTRO-MECHANICS CO., LTD., Suwon-si (KR)

(72) Inventor: Young Pyo Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/788,874

(22) Filed: Oct. 20, 2017

(65) Prior Publication Data
US 2018/0286813 A1  Oct. 4, 2018

(30) Foreign Application Priority Data
Mar. 30, 2017  (KR) ........................ 10-2017-0040521

(51) Int. Cl.
*H01L 23/538*  (2006.01)
*H01L 23/31*  (2006.01)
(Continued)

(52) U.S. Cl.
CPC ........ *H01L 23/5389* (2013.01); *H01L 21/486* (2013.01); *H01L 21/4853* (2013.01); *H01L 21/4857* (2013.01); *H01L 21/561* (2013.01); *H01L 21/565* (2013.01); *H01L 23/3114* (2013.01); *H01L 23/5383* (2013.01); *H01L 23/5384* (2013.01); *H01L 23/5385* (2013.01); *H01L 23/5386* (2013.01); *H01L 24/19* (2013.01); *H01L 24/20* (2013.01); *H01L 23/3128* (2013.01); *H01L 2224/16225* (2013.01); *H01L 2224/214* (2013.01); *H01L 2924/15174* (2013.01); *H01L 2924/15192* (2013.01); *H01L 2924/15311* (2013.01); *H01L 2924/181* (2013.01)

(58) Field of Classification Search
CPC ............. H01L 21/4853; H01L 21/4857; H01L 21/486; H01L 21/565; H01L 23/3114; H01L 23/5383; H01L 23/5384; H01L 23/5385; H01L 23/5386; H01L 23/5389
See application file for complete search history.

(56) References Cited

U.S. PATENT DOCUMENTS

| | | | |
|---|---|---|---|
| 2013/0127025 A1 | 5/2013 | Cho | |
| 2015/0062854 A1* | 3/2015 | Choi | ..................... H01L 21/561 361/784 |
| 2016/0293537 A1* | 10/2016 | Sugiyama | ............... H01L 23/13 |

FOREIGN PATENT DOCUMENTS

| | | | | |
|---|---|---|---|---|
| KR | 10-2013-0056570 A | | 5/2013 | |
| KR | 10-2015-0000174 A | * | 1/2015 | ........... H01L 21/565 |
| KR | 10-2015-0025129 A | | 3/2015 | |

* cited by examiner

*Primary Examiner* — Joseph M Galvin, III
(74) *Attorney, Agent, or Firm* — NSIP Law

(57) ABSTRACT

A electronic device module includes a first substrate; electronic devices mounted on the first substrate; a second substrate coupled to a lower surface of the first substrate, the second substrate including a device accommodating portion; a sealing portion configured to seal an electronic device in the device accommodating portion; and an external connection terminal bonded to an electrode pad disposed in a lower surface of the second substrate. Bonding surfaces of the electrode pad and the external connection terminal are disposed on a same plane as a lower surface of the sealing portion.

10 Claims, 18 Drawing Sheets

(51) Int. Cl.
*H01L 21/48* (2006.01)
*H01L 21/56* (2006.01)
*H01L 23/00* (2006.01)

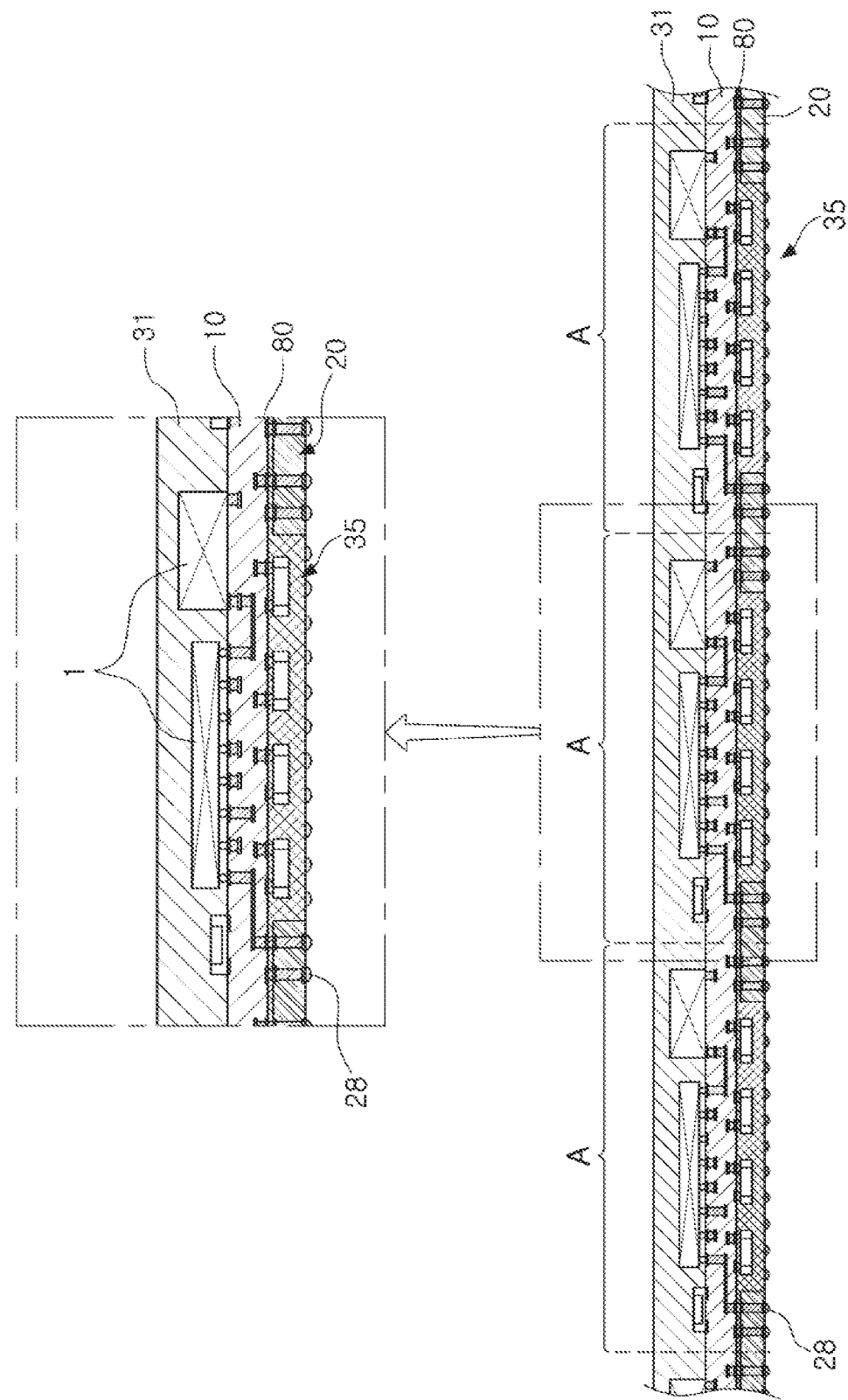

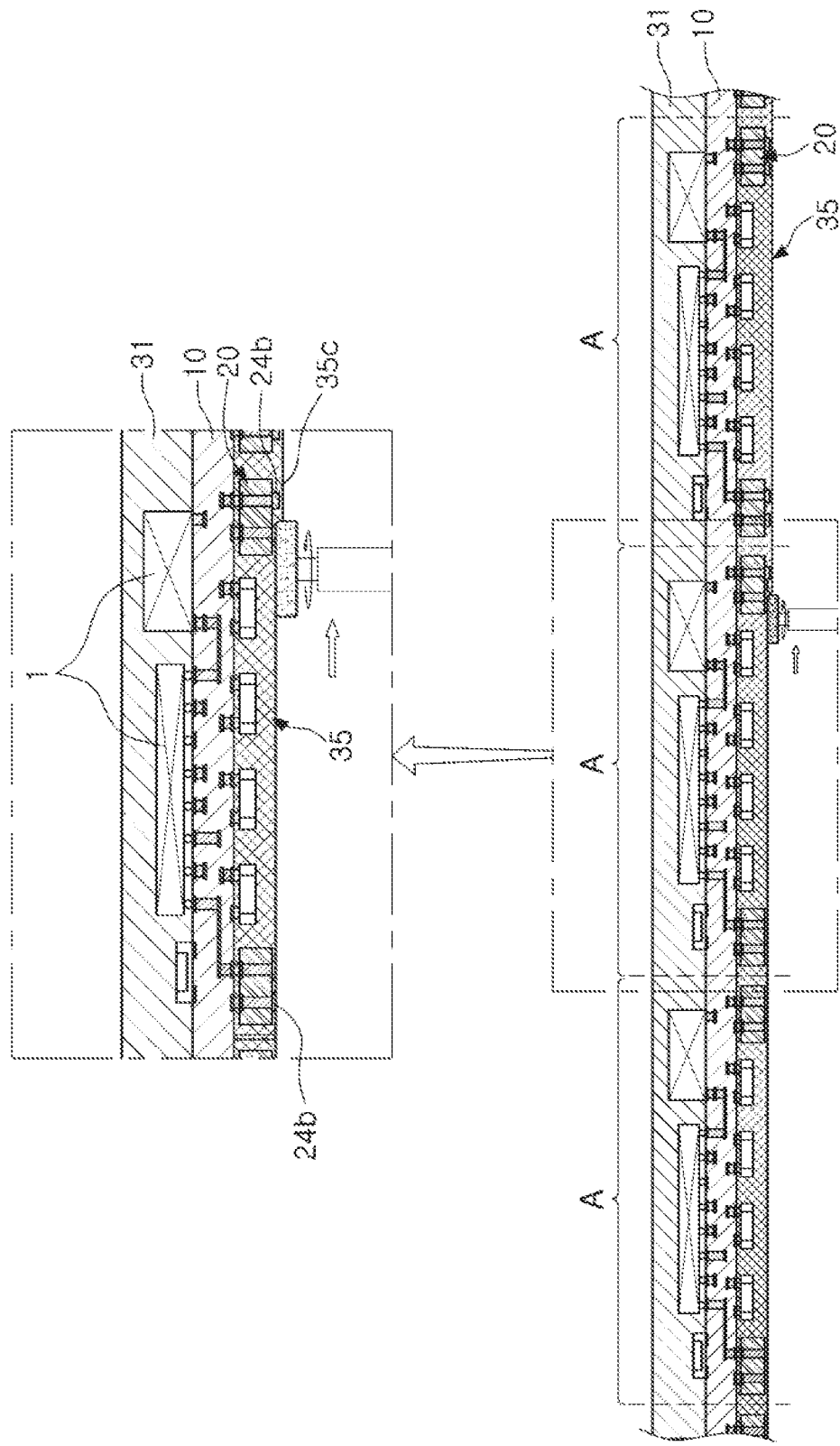

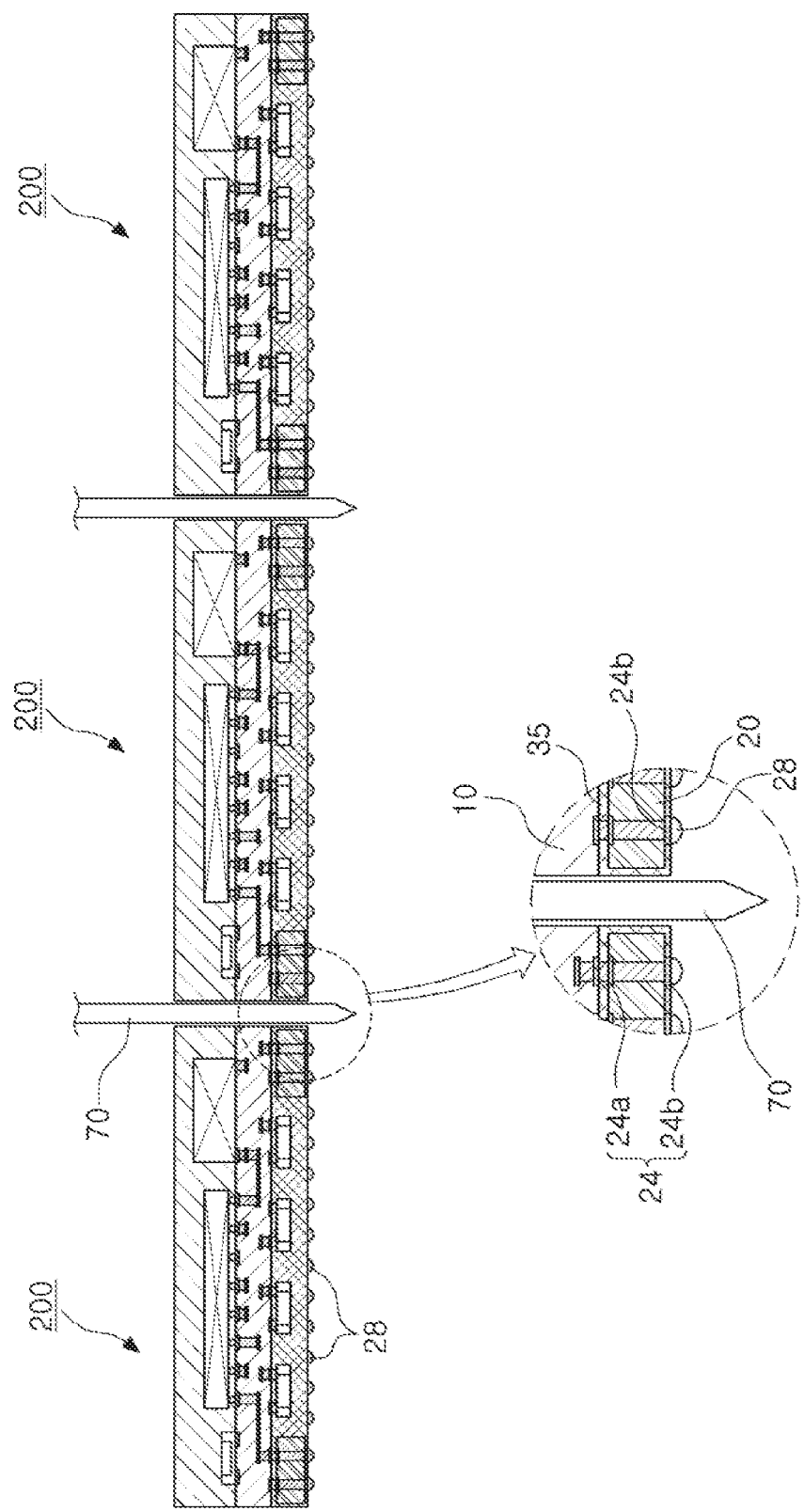

ELECTRONIC COMPONENT MODULE AND METHOD OF MANUFACTURING THE SAME

CROSS-REFERENCE TO RELATED APPLICATION(S)

This application claims the benefit under 35 USC 119(a) of Korean Patent Application No. 10-2017-0040521 filed on Mar. 30, 2017 in the Korean Intellectual Property Office, the entire disclosure of which is incorporated herein by reference for all purposes.

BACKGROUND

1. Field

The following description relates to an electronic device module and a method of manufacturing the same.

2. Description of Related Art

Recently, in markets for electronic products, demand for portable devices has rapidly increased and there is continuing demand for the miniaturization and reduction in size and weight of electronic devices mounted in these products.

In order to realize miniaturization and weight reduction requirements for such electronic devices, techniques are developed for reducing the individual size of a mounting component, system on chip (SOC), or system in package (SIP), or the like.

In order to manufacture a small and high performance electronic device module, the structure in which electronic components are mounted on both surfaces of a substrate.

However, when the electronic components are mounted on both surfaces of the substrate, there may be a problem in which it is difficult to form an external connection terminal on the substrate.

In other words, as electronic components mounted on both surfaces of a substrate are mounted, a position in which an external connection terminal may be formed is obscured. Thus, a double-sided mounting type electronic device module, capable of easily forming an external connection terminal, and a method of easily manufacturing the same is required.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an electronic device module, includes a first substrate; electronic devices mounted on the first substrate; a second substrate coupled to a lower surface of the first substrate, the second substrate including a device accommodating portion; a sealing portion configured to seal an electronic device in the device accommodating portion; and an external connection terminal bonded to an electrode pad disposed in a lower surface of the second substrate. Bonding surfaces of the electrode pad and the external connection terminal are disposed on a same plane as a lower surface of the sealing portion.

The sealing portion may include a gap sealing portion filling a gap between the first substrate and the second substrate.

The sealing portion may include a first sealing portion sealing the electronic devices mounted on an upper surface of the first substrate, and a second sealing portion sealing electronic devices mounted on the lower surface of the first substrate.

The sealing portion may further comprises a lower surface sealing portion covering a lower surface of the second substrate. The electrode pad may pass through the lower surface sealing portion. The bonding surfaces may be disposed on a same plane as a lower surface of the lower surface sealing portion.

The second substrate may include an insulating substrate having an insulating layer; a first electrode pad and a second electrode pad disposed on opposing surfaces of the insulating substrate, respectively; and a conductive via passing through the insulating substrate and electrically connecting the first electrode pad to the second electrode pad.

The second electrode pad may protrude from the insulating substrate.

The second substrate may be a printed circuit board (PCB).

In another general aspect, a method of manufacturing an electronic device module, includes preparing a first substrate; mounting electronic devices and a second substrate on the first substrate; forming a sealing portion embedding the second substrate; exposing a top surface of an electrode pad disposed in a lower surface of the second substrate by grinding the sealing portion formed below the second substrate; and bonding an external connection terminal to the top surface of the electrode pad.

The second substrate may include a device accommodating portion accommodating an electronic device, and the second substrate may be bonded to the first substrate.

The second substrate prepared in the mounting the second substrate may include an insulating substrate having an insulating layer; a first electrode pad and a second electrode pad disposed on opposing surfaces of the insulating substrate, respectively; and a conductive via passing through the insulating substrate and electrically connecting the first electrode pad to the second electrode pad. Thicknesses of the first electrode pad and the second electrode pad may be formed to be differently.

The second electrode pad to which the external connection terminal is bonded may be formed thicker than the first electrode pad.

A lower surface of the second substrate may be formed by removing the sealing portion formed below the second substrate.

In another general aspect, an electronic device module, includes a first substrate having electronic devices disposed on opposing surfaces of the first substrate; a second substrate having an upper surface coupled to a lower surface of the first substrate, the second substrate including a device accommodating portion having an electronic device coupled to an electrode pad; and a sealing portion configured to seal an upper surface of the first substrate, electronic devices disposed on the upper surface of the first substrate, the device accommodating portion and a lower surface of the second substrate. A lower surface of the electrode pad is externally exposed through the sealing portion. Portions of lower surfaces of the sealing portion is disposed on the device accommodating portion and the second substrate are coplanar with the lower surface of the electrode pad.

The second substrate may include an insulating substrate having an insulating layer; a first electrode pad and a second electrode pad disposed on opposing surfaces of the insulating substrate, respectively; and a conductive via passing through the insulating substrate and electrically connecting the first electrode pad to the second electrode pad.

The second electrode pad may protrude from the insulating substrate.

Other features and aspects will be apparent from the following detailed description, the drawings, and the claims.

BRIEF DESCRIPTION OF THE DRAWINGS

FIGS. 6A through 6E are cross-sectional views illustrating a method of manufacturing the electronic device module of FIG. 5.

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
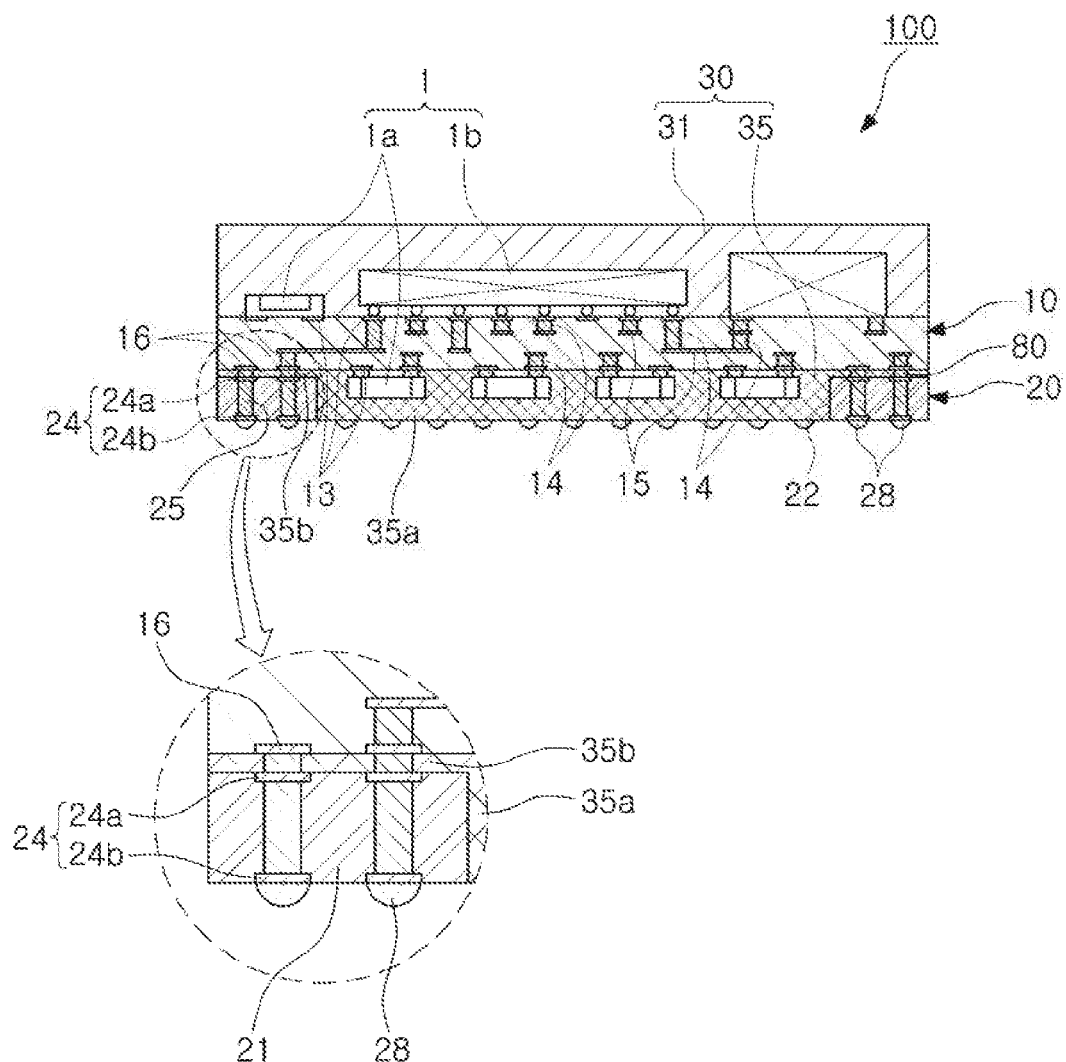
FIG. 1 is a cross-sectional view schematically illustrating an example of an electronic device module.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a cross-sectional view schematically illustrating an example of an electronic device module. In addition, FIG. 2 is a partial cut-away perspective view illustrating an interior of the electronic device module of FIG. 1, and FIG. 3 is an exploded perspective view of the electronic device module of FIG. 1.

Figure 2:
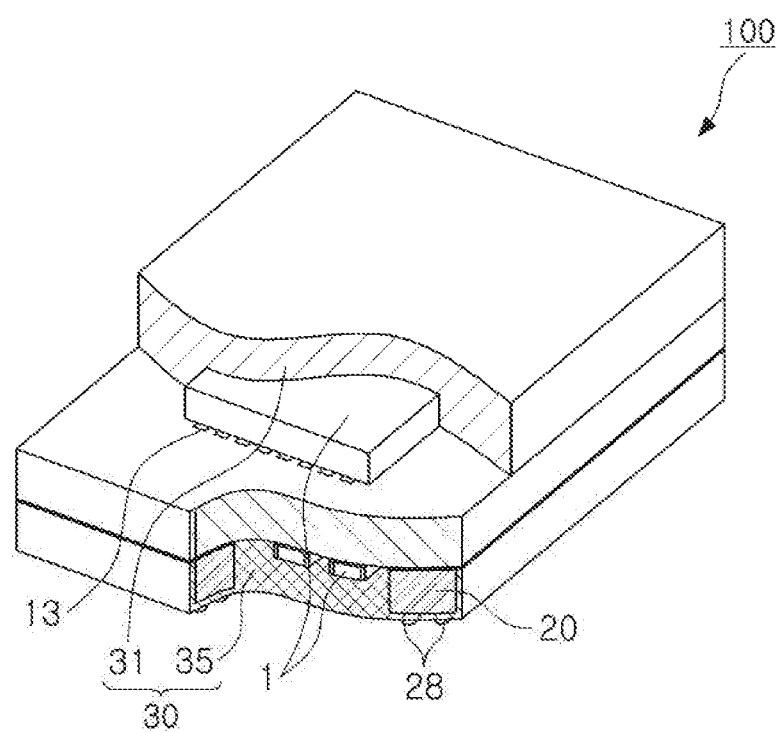
FIG. 2 is a partial cut-away perspective view illustrating an interior of the electronic device module of FIG. 1.
Figure 3:
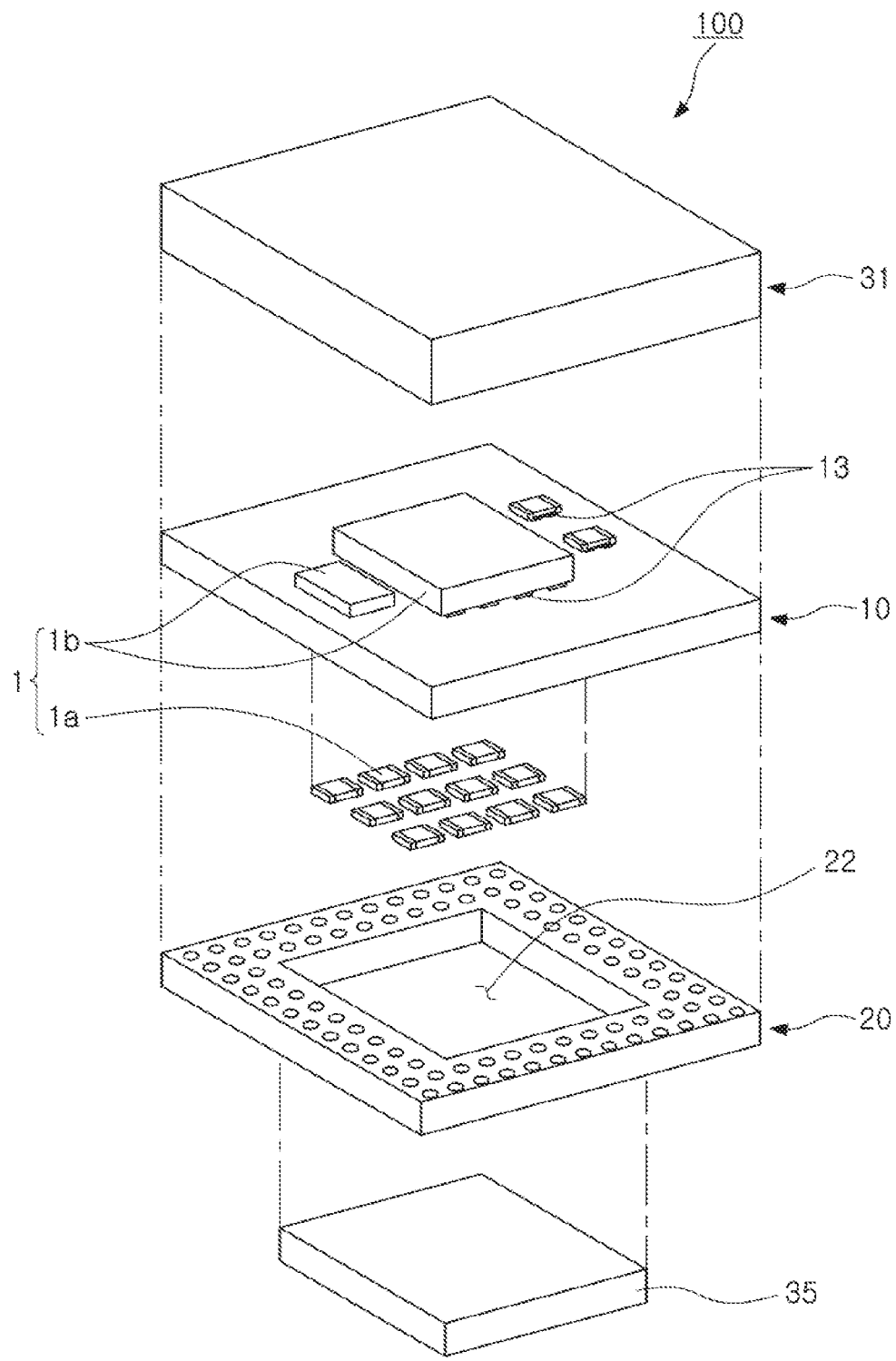
FIG. 3 is an exploded perspective view of the electronic device module of FIG. 1.

Referring to FIGS. 1 through 3, an electronic device module 100 includes an electronic device 1, a first substrate 10, a second substrate 20, and a sealing portion 30.

The electronic device 1 includes various devices such as an inactive device 1a and an active device 1b, and any other type of devices that can be mounted on a substrate.

The electronic device 1 may be mounted on an upper surface and a lower surface of the first substrate 10 which will be described later. FIG. 1 depicts a case in which the active device 1b and the inactive device 1a are mounted on the upper surface of the first substrate 10, and only the inactive device 1a is mounted on the lower surface, but the example is not limited thereto. According to the size or shape of the electronic devices 1, and the design of the electronic device module 100, the electronic devices 1 may be disposed on both surfaces of the first substrate 10 in various forms.

The first substrate 10 may be a multilayer substrate formed of a plurality of layers, and a circuit pattern 15 for forming of an electrical connection may be formed between respective layers.

The first substrate 10 may be any type of substrate known in the art (for example, a ceramic substrate, a printed circuit board, a flexible substrate, and the like). On both surfaces of the first substrate 10, a mounting electrode 13 for mounting the electronic device 1 is formed. Although, not illustrated, a wiring pattern for electrically connecting mounting electrodes 13 to each other may also be formed.

The first substrate 10 includes a conductive via 14 electrically connecting the mounting electrode 13, formed in both surfaces first substrate 10, to circuit patterns 15 formed in the first substrate 10.

In addition, the first substrate 10 has an external connection pad 16 in a lower surface thereof. The external connection pad 16 is provided to be electrically connected to the second substrate 20 which will be described later. Thus, the external connection pad 16 is formed in an upper surface of the first and second substrates 10, 20 when the second substrate 20 is combined with the first substrate 10. A plurality of pads for external connection may be disposed in various forms as required.

The second substrate 20 is disposed below and then coupled to the first substrate 10.

The second substrate 20 may be formed of a single substrate or a plurality of substrates. The second substrate 20, according to the example, is formed of a single substrate and has a device accommodating portion 22 therein.

The device accommodating portion 22 is provided in the form of a space in which the electronic devices 1 mounted on a lower surface of the first substrate 10 are accommodated. Thus, the electronic devices 1 mounted on the lower surface of the first substrate 10 are only mounted in a position opposing the device accommodating portion 22 of the second substrate 20, of the lower surface of the first substrate 10.

The second substrate 20 may be any type of substrate known in the art (for example, a ceramic substrate, a printed circuit board, a flexible substrate, and the like), in the same manner as the first substrate 10.

The second substrate 20 is a printed circuit board (PCB). In more detail, the second substrate includes an insulating substrate 21 including at least one insulating layer, a first electrode pad 24a and a second electrode pad 24b disposed on both surfaces of the insulating substrate 21, respectively, as well as a conductive via 25 passing through the insulating substrate 21.

The electrode pad 24 is disposed in each of both surfaces of the insulating substrate 21. The first electrode pad 24a formed in an upper surface of the insulating substrate 21 is electrically connected to the external connection pad 16 of the first substrate 10. In addition, the second electrode pad 24b formed in a lower surface of the insulating substrate 21 is provide to be fastened to an external connection terminal 28. Although not illustrated, a wiring pattern electrically connecting electrode pads 24 to each other may be formed in each of both surfaces of the second substrate 20.

In an example, the second substrate 20 is a double-sided substrate in which a conductor layer is formed on each of both surfaces of a single layer insulating substrate, but the example is not limited thereto. The second substrate may be a multilayer substrate in which a plurality of insulating layers are stacked. In this case, a circuit pattern (not shown) for formation of an electrical connection may be formed between respective insulating layers.

The conductive via 25 allows the electrode pads 24 disposed in both surfaces of the insulating substrate 21 to be electrically connected to circuit patterns formed in the insulating substrate 21.

In addition, the second substrate 20 according to an example may be formed to have a thickness thicker than a mounting height of the electronic devices 1 mounted on a lower surface of the first substrate 10, in order to stably protect the electronic devices 1 accommodated in the device accommodating portion 22, but the example is not limited thereto.

The external connection terminal 28 is bonded to a lower surface of the second substrate 20. The external connection terminal 28 allows the electronic device module 100 to be electrically and physically connected to a main substrate (not shown) on which the electronic device module 100 is mounted.

The external connection terminal 28 is bonded to the second electrode pad 24b formed in the lower surface of the second substrate 20. The external connection terminal 28 is provided in the form of a solder ball, but the example is not limited thereto. The external connection terminal may be provided in various forms such as a bump, a pad, and the like.

The external connection terminal 28 is electrically connected to the electrode pads 24 formed in an upper surface through the conductive via 25, or the like. Thus, when the second substrate 20 is combined with the first substrate 10, the first substrate 10 is electrically connected to the external connection terminal 28 through the second substrate 20.

The second substrate 20 is bonded to the first substrate 10 through a conductive adhesive such as a solder bonding portion 80, while being electrically connected to the first substrate 10. The solder bonding portion 80 is formed, as a solder paste printed on the first substrate 10, and then melted and cured.

The sealing portion 30 includes a first sealing portion 31 formed in an upper surface of the first substrate 10 and a second sealing portion 35 formed in a lower surface thereof.

The first sealing portion 31 allows the electronic devices 1 mounted on the upper surface of the first substrate 10 to be sealed.

The first sealing portion 31 fills a gap between the electronic devices 1 mounted on the first substrate 10, so an electrical short-circuit between the electronic devices 1 is prevented. In addition, the sealing portion 30 surrounds exteriors of the electronic devices 1 and fix the electronic devices 1 to a substrate, thereby safely protecting the electronic devices 1 from an external impact.

The first sealing portion 31 is formed of an insulating material containing a resin material, such as an epoxy, an epoxy molding compound (EMC), or the like. In addition, the first sealing portion 31 is formed as the first substrate 10 in which the electronic devices 1 are mounted on an upper surface, is placed on a mold (not shown), and a molding resin is injected into the mold.

The second sealing portion 35 includes a device sealing portion 35a, formed in the device accommodating portion 22 of the second substrate 20, and a gap sealing portion 35b filling a gap between the first substrate 10 and the second substrate 20. In addition, a lower surface of the second substrate 20 is externally exposed from the surface of the second sealing portion 35.

As the second sealing portion 35 is formed to fill the entirety of an interior of the device accommodating portion 22, the electronic devices 1 accommodated in the device accommodating portion 22 become embedded in the second sealing portion 35. However, as required, a portion of the electronic device 1 may be formed to be externally exposed through the second sealing portion 35.

The second sealing portion 35 is formed using a molding method of injecting a molding resin in the same manner as the first sealing portion 31. In other words, the second sealing portion is formed similarly to the first substrate 10, in which the electronic devices 1 and the second substrate 20 are mounted on a lower surface, is placed in a mold (not shown), and a molding resin is injected into the mold.

In the electronic device module 100 according to an example, a lower surface of the second substrate 20 is grounded in a manufacturing process so as to reduce the thickness of the second substrate 20. In the operation described above, the second substrate 20 and the second sealing portion 35 are grounded together, so a portion thereof is removed. Finally, a bonding surface of the second electrode pad 24b and the external connection terminal 28 are disposed on the same plane as a lower surface of the second sealing portion 35.

The electronic device module 100 configured as described above is better integrated, as the plurality of electronic devices 1 are mounted on both surfaces of a single substrate (that is, the first substrate).

In addition, the electronic device module 100 is sealed by the first sealing portion 31 and the second sealing portion 35 even when the electronic devices 1 are mounted on both surfaces of the first substrate 10. Thus, even when a conductive adhesive is melted by the heat generated by the electronic device module 100 when mounted on a different main substrate, movement of the second substrate 20 or the electronic devices 1 are fixed by the sealing portion 30. Thus, bond reliability between the electronic devices 1 and the first substrate 10 and the second substrate 20 is increased.

Next, a method of manufacturing an electronic device module according to an example will be described.

FIGS. 4A through 4I are cross-sectional views illustrating a method of manufacturing the electronic device module of FIG. 1.

Figure 4A:
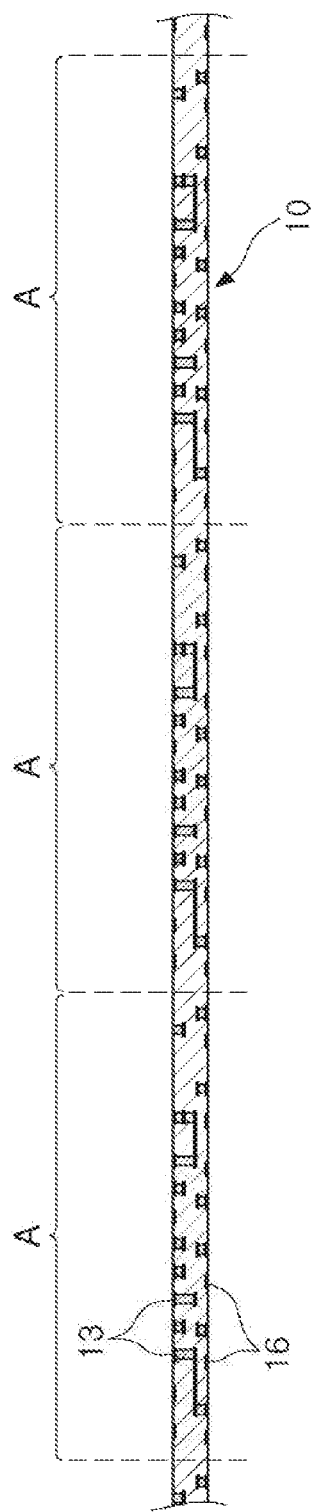
FIGS. 4A through 4I are cross-sectional views illustrating a method of manufacturing the electronic device module of FIG. 1.

First, as illustrated in FIG. 4A, preparing of the first substrate 10 is performed. As described previously, the first substrate 10 may be a multilayer substrate, and the mounting electrode 13 may be formed in each of both surfaces. In addition, the external connection pad 16 may be formed in a lower surface.

In detail, the first substrate 10 prepared in an operation described above is a substrate in which a plurality of individual module mounting areas A, which are the same, are repeatedly disposed. The first substrate 10 may be rectangular in shape with a large area, or have a long strip shape.

The first substrate 10 is provided to manufacture a plurality of individual modules at the same time. The first substrate 10 is divided into the plurality of individual module mounting areas A, and an electronic device module is manufactured for each of the plurality of individual module mounting areas A.

Figure 4B:
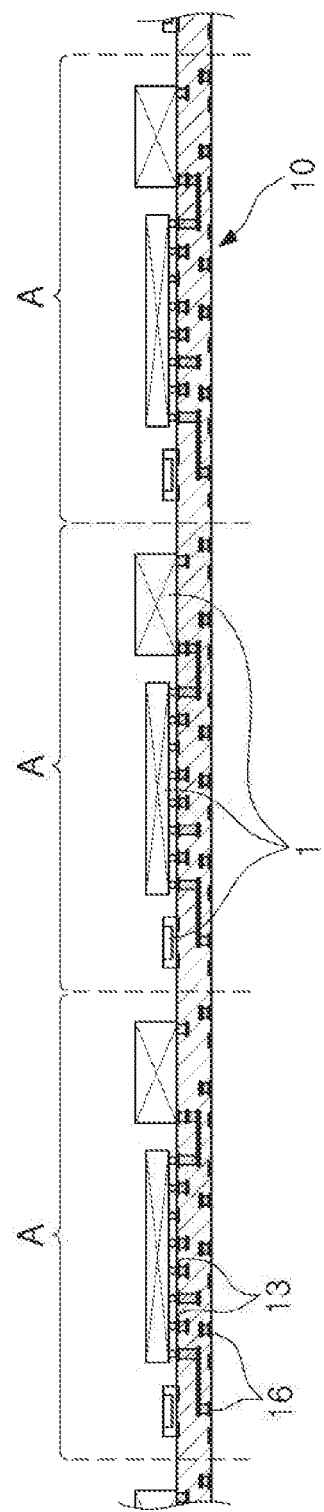

Next, as illustrated in FIG. 4B, mounting of the electronic devices 1 on one surface of the first substrate 10, that is, an upper surface, is performed. As the operation described above is performed, a solder paste is printed on the mounting electrode 13 formed on one surface of the first substrate 10 using a screen printing method, or the like. The electronic devices 1 are then placed thereon and heat is used to melt the solder paste before being cured.

In this case, the electronic devices 1, which are the same, are arranged identically in each individual module mounting area A, and are then mounted thereon.

Figure 4C:
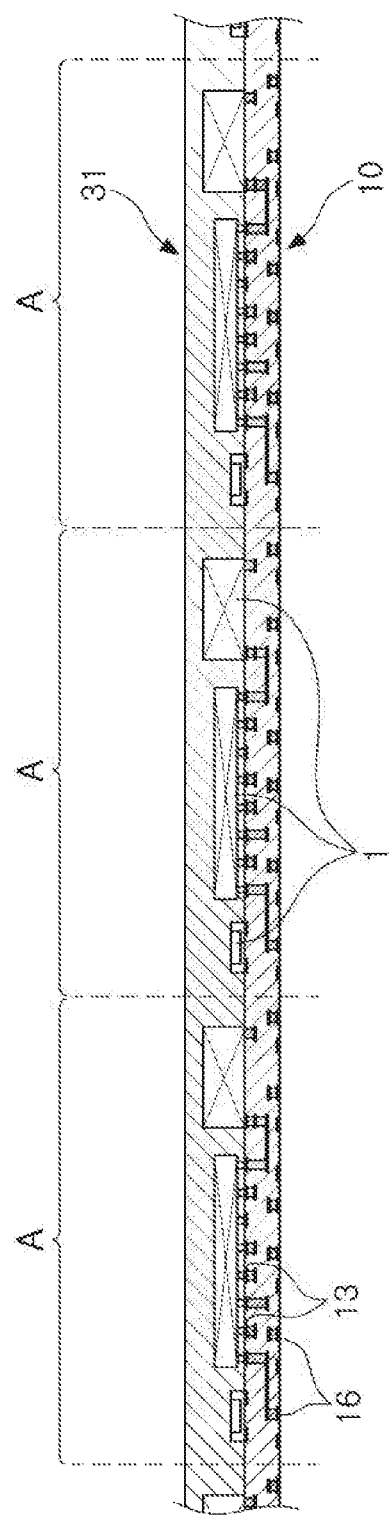

Next, as illustrated in FIG. 4C, forming of the first sealing portion 31 on one surface of the first substrate 10 while sealing the electronic devices 1 is performed. As described previously, after the first substrate 10 on which the electronic device 1 is mounted is disposed in a mold, a molding resin is injected into the mold so as to form the first sealing portion. As the first sealing portion 31 is formed, the electronic devices 1 mounted on one surface, an upper surface, of the first substrate 10 are protected from external impact by the first sealing portion 31.

Although, the first sealing portion 31 is integrally formed to cover several individual module mounting areas A on the first substrate 10, the example is not limited thereto. As required, the first sealing portion 31 may be divided for each individual module mounting area A to be independently provided.

Figure 4D:
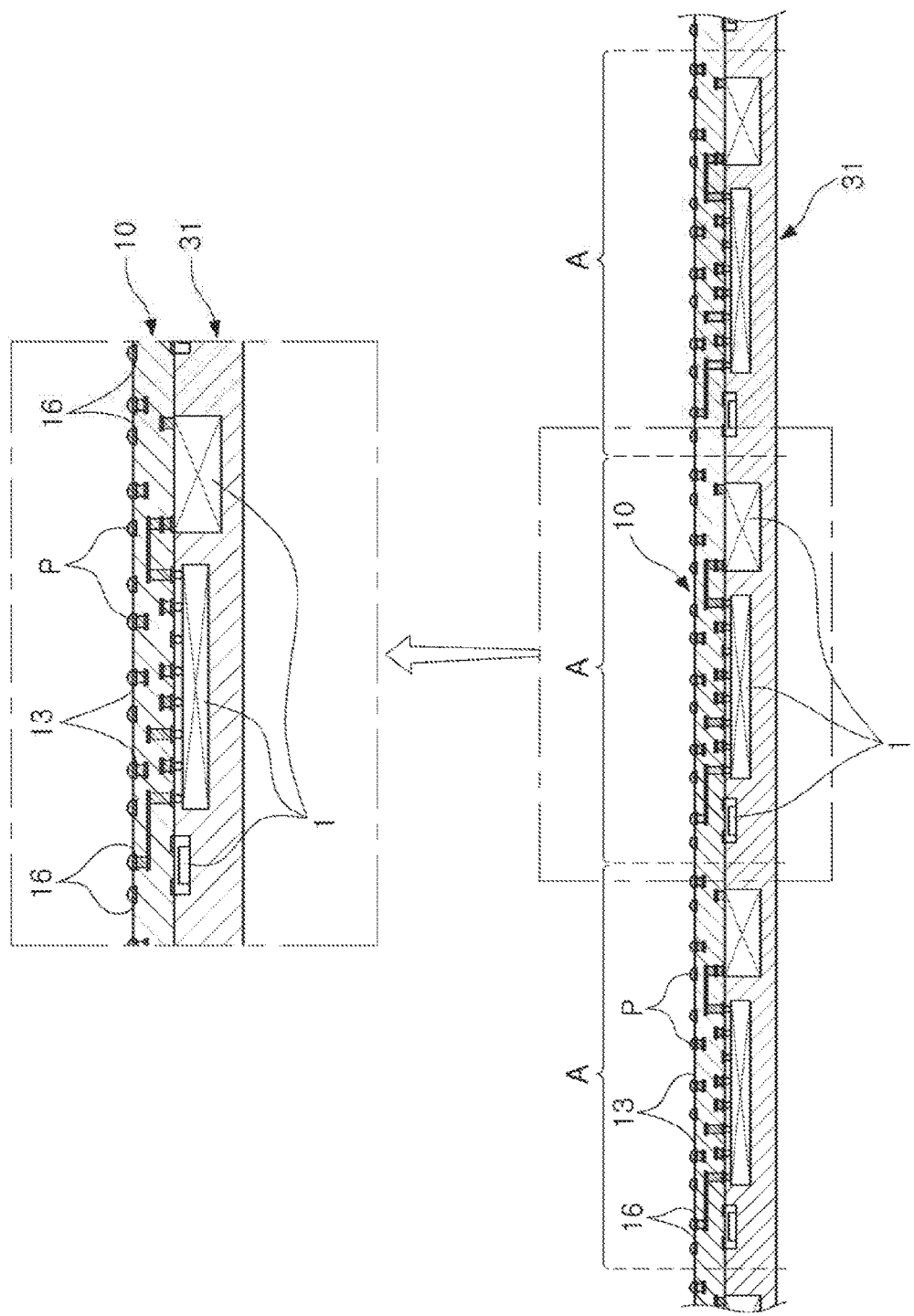

Next, as illustrated in FIG. 4D, the printing of a solder paste P on the other surface, a lower surface, of the first substrate 10 in which the first sealing portion 31 is formed is performed. In this case, the solder paste P is not only printed on the mounting electrode 13, but also on the external connection pad 16.

Figure 4E:
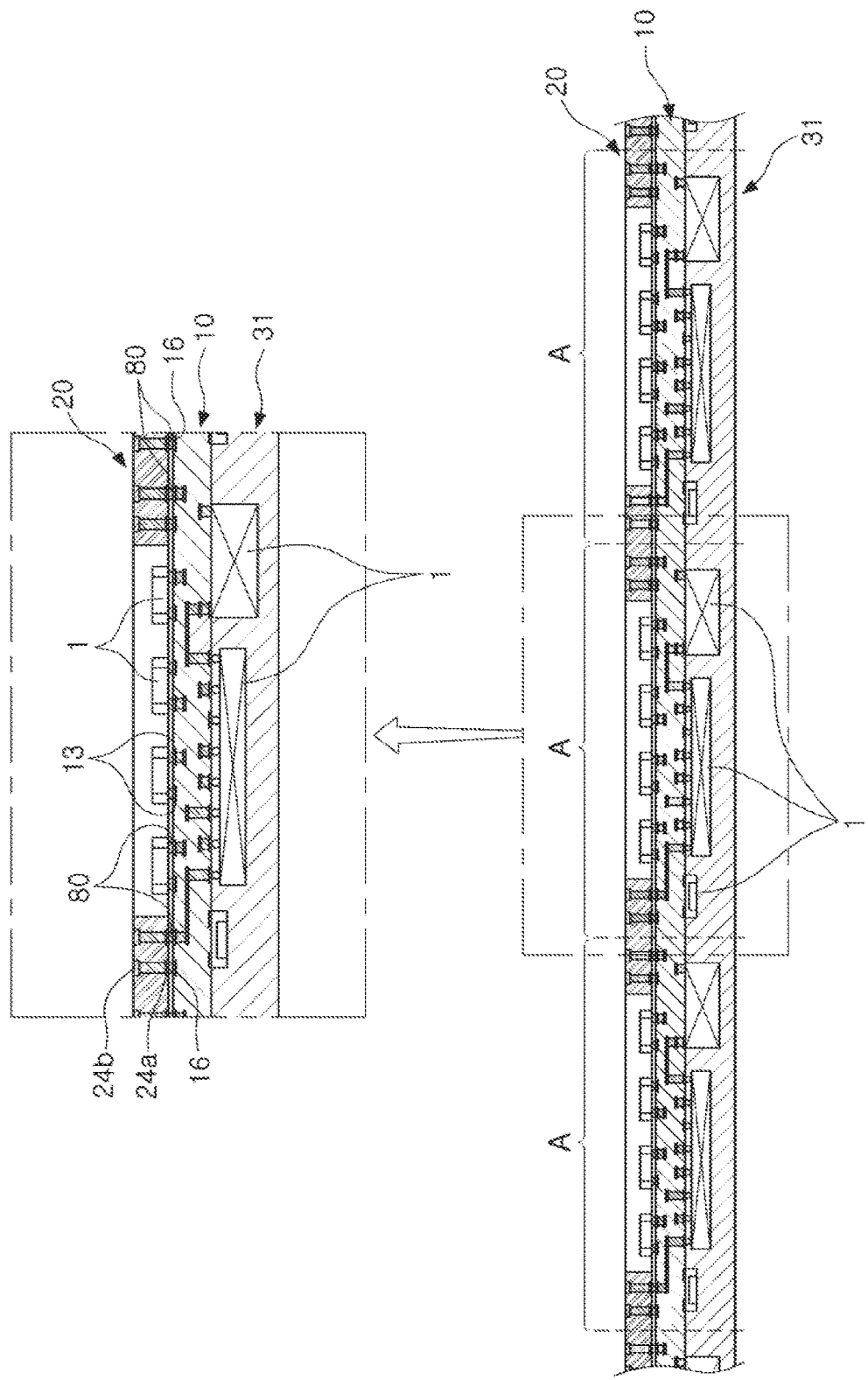

Next, as illustrated in FIG. 4E, mounting of the electronic devices 1 and the second substrate 20 on the other surface of the first substrate 10 on which the solder paste P is printed is performed.

In the operations described above, the electronic devices 1 are first mounted on the first substrate 10 first before the second substrate 20 is mounted but the example is not limited thereto. The operations described above may be performed using various methods. For example, the second substrate 20 may be mounted first, or the second substrate 20 and the electronic devices 1 may be simultaneously mounted.

Although, the second substrate 20 in this example is provided as a single substrate having a plurality of individual module mounting areas A in a similar manner to the first substrate 10, the example is not limited thereto. The second substrate may be provided as a plurality of substrates individually attached to the individual module mounting areas A, as in an example of FIG. 6A, which will be described later.

In addition, in the operation described above, the second substrate 20 bonded to the first substrate 10 is formed to have a thickness thicker than that of the second substrate 20 of a final product illustrated in FIG. 1.

In the method of manufacturing an electronic device module according to an example, grinding of a lower surface is performed at a later time. Grinding is used to reduce the thickness of the second substrate 20 to realize the thickness of the second substrate 20 illustrated in FIG. 1.

Thus, the second substrate 20 in the operation described above is formed to have a thickness relative to the portion removed by the grinding operation described above.

In addition, the second electrode pad 24b disposed in a lower surface of the second substrate 20 is also formed to be thicker than the first electrode pad 24a based on the portion to be removed in the grinding operation described above.

When the electronic device 1 and the second substrate 20 are mounted on the other surface of the first substrate 10, heat is applied so as to melt and cure the solder paste (P of FIG. 4D), thereby forming the solder bonding portion 80. The electronic devices 1 and the second substrate 20 mounted on a lower surface of the first substrate 10 by the solder bonding portion 80 are firmly fixed and bonded to the first substrate 10 so as to be electrically and physically connected to the first substrate 10.

Figure 4F:
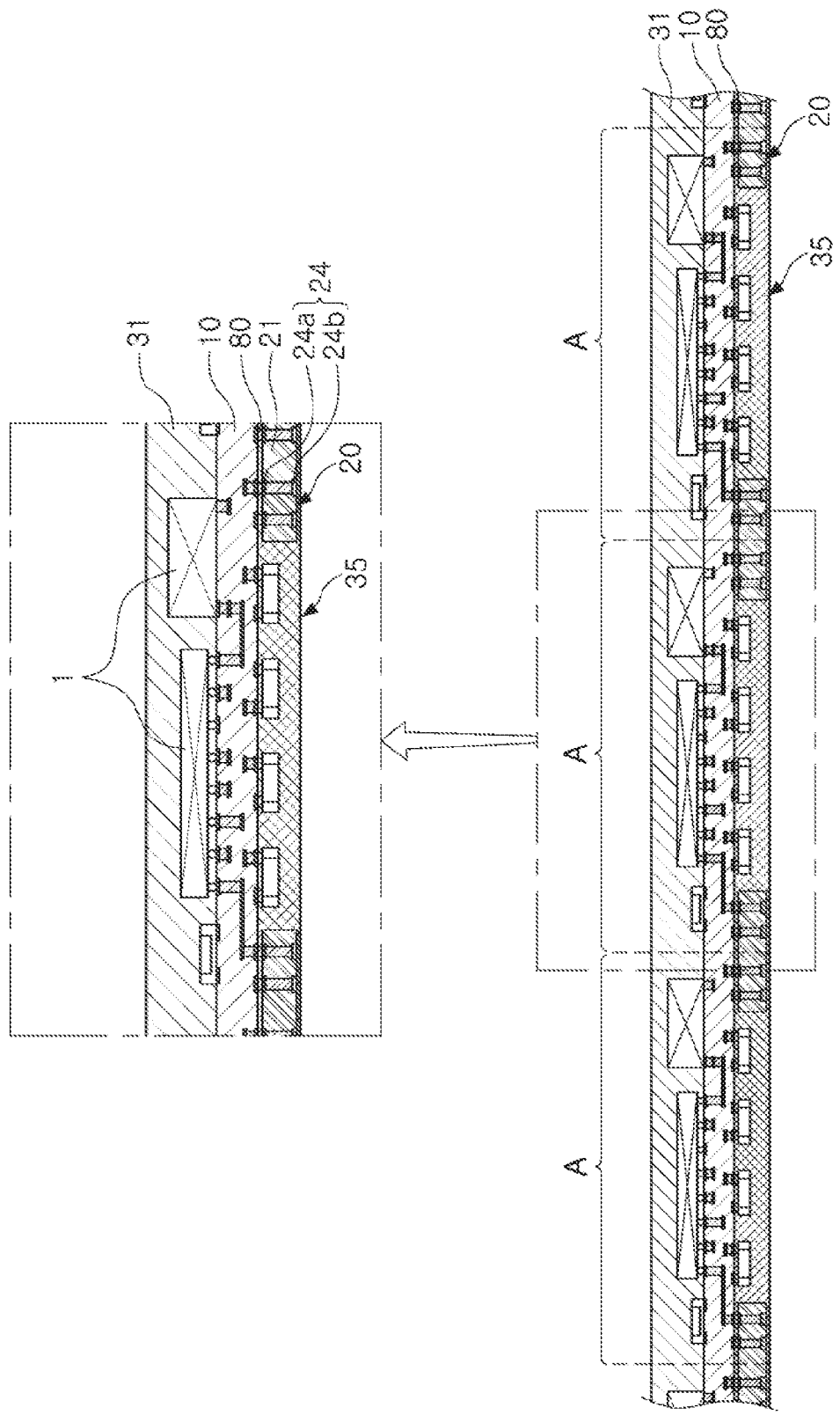

Next, as illustrated in FIG. 4F, forming of the second sealing portion 35 in a lower surface of the first substrate 10 is performed. In the operation described above, in a similar manner to the first sealing portion 31, after the first substrate 10 on which the electronic device 1 and a second substrate are mounted on a lower surface is disposed in a mold, a molding resin is injected into the mold to form the second sealing portion.

The second sealing portion 35 embeds the electronic devices 1 and the second substrate 20 mounted on the lower surface of the first substrate 10.

In the operation described above, the molding resin injected into the mold flows into gaps formed between the first substrate 10 and the second substrate 20 due to the solder bonding portion 80.

The second sealing portion 35 fills gaps between the first substrate 10 and the second substrate 20, thereby mutually isolating the first substrate 10 and the second substrate 20. Simultaneously, the second sealing portion bonds the first substrate 10 to the second substrate 20, thereby increasing bonding strength between the first substrate 10 and the second substrate 20.

Figure 4G:
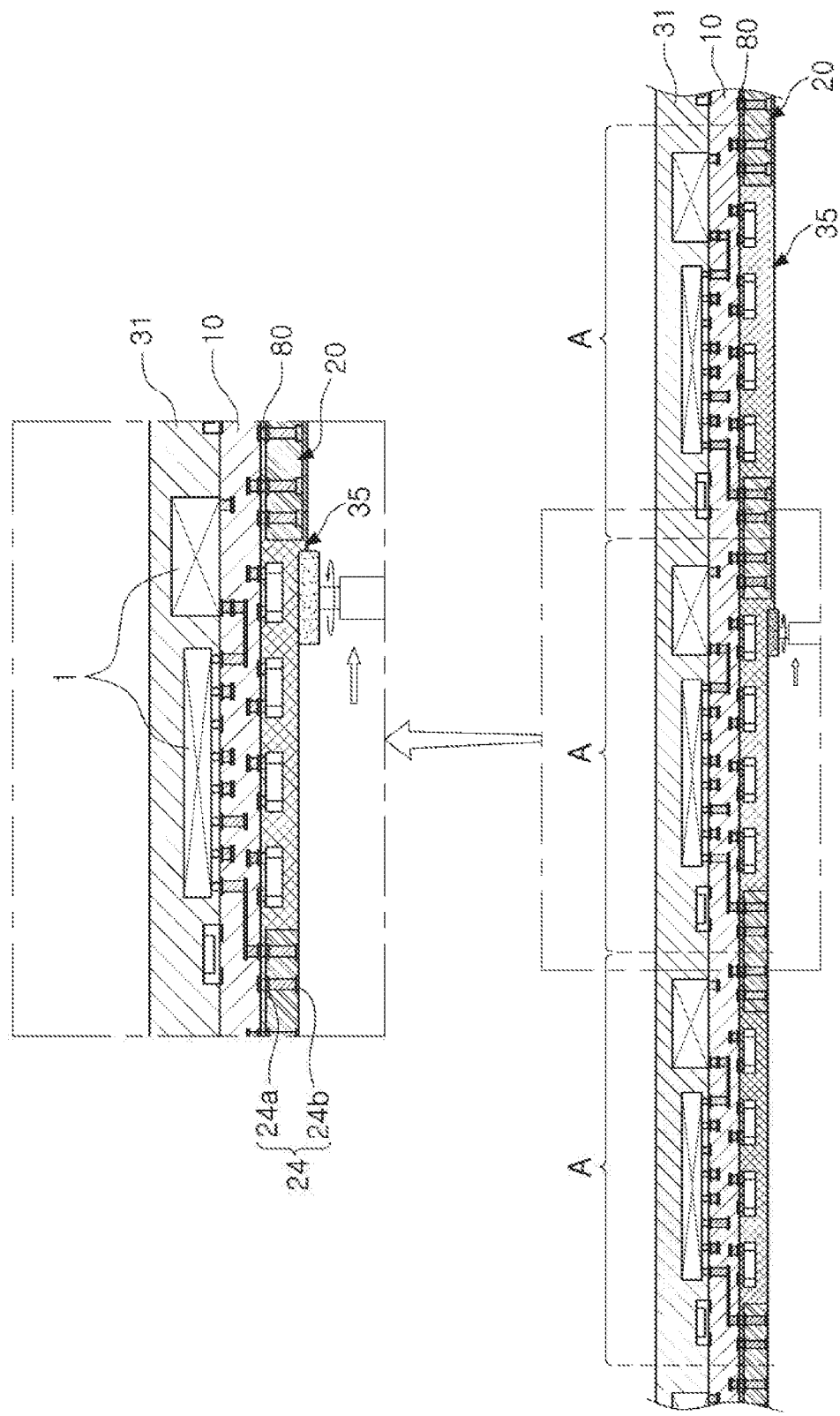
Figure 4:
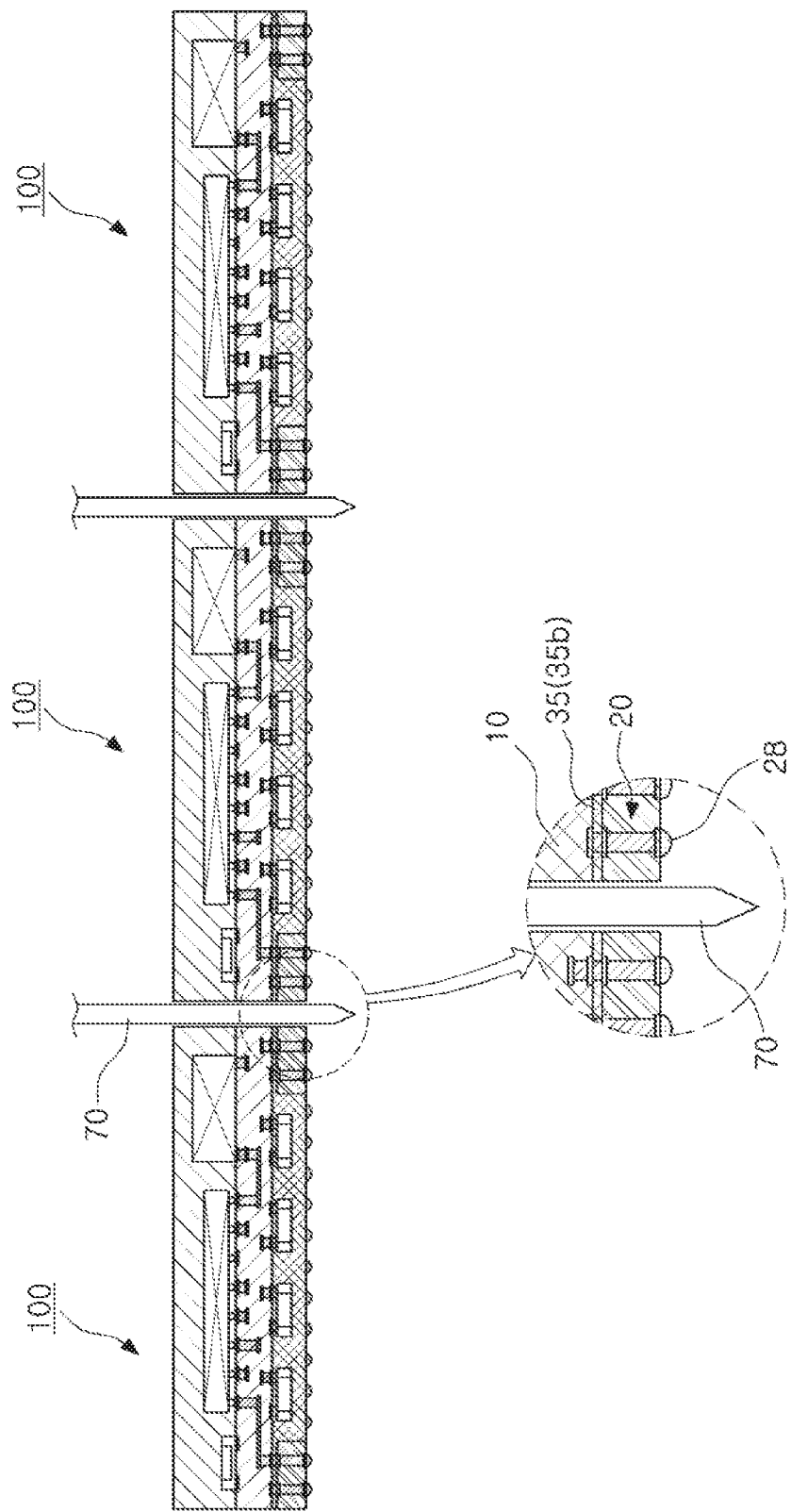

Next, as illustrated in FIG. 4G, the second sealing portion 35 and a lower surface of the second substrate 20 are grounded to reduce the thickness of the second substrate 20. In the grinding operation, the second sealing portion 35 formed on the lower surface of the second substrate 20 is removed in addition to partial portions of the second substrate 20 so that the lower surface of the second substrate 20 is externally exposed.

In addition, the second electrode pad 24b of the second substrate 20 is partially removed to reduce its thickness. Thus, the second electrode pad 24b is formed to have a similar thickness to that of the first electrode pad 24a.

Thus, the thickness of the second substrate 20 is reduced to the thickness of the second substrate 20 illustrated in FIG. 1. In addition, second electrode pads 24b disposed in the lower surface of the second substrate 20 are externally exposed.

Next, as illustrated in FIG. 4H, external connection terminals 28 are formed in the lower surface of the second substrate 20. The external connection terminals 28 are fastened to the second electrode pads 24b exposed through the lower surface of the second substrate 20.

The external connection terminals 28 are provided in the form of solder balls but the example is not limited thereto. The external connection terminals may be provided in various forms such as bumps, pads, and the like.

Next, as illustrated in FIG. 4I, the electronic device module 100 are individually formed by cutting the first substrate 10 on which the sealing portion 30 is formed.

In the operation described above, the first substrate 10, on which the sealing portion 30 is formed, and the second substrate 20 are cut along a boundary of an individual module mounting area (A of FIG. 4H) using a blade 70.

The electronic device module, manufactured through the operations described above, is fixed and bonded through a curing process after electronic devices and a second substrate are mounted on a lower surface of a first substrate. Thus, compared to a method in which electronic devices and a second substrate are separately bonded to a first substrate, the manufacturing processes is less involved, simpler, and easier to perform.

In addition, a molding resin fills a gap between a first substrate and a second substrate, so it is not necessary to inject a resin solution in the form of a liquid (for example, an underfill epoxy, or the like) in order to fill the gap as done in the related art. It is not required to manage the amount of resin injection needed, thus simplifying the manufacturing process.

In addition, through a second sealing portion, electronic devices mounted below a first substrate are sealed, so the electronic devices are externally protected from the environment.

In addition, in the method of manufacturing the electronic device module, after a second substrate is sealed, the sealing portion is grounded to externally expose the electrode pad of the second substrate.

When the sealing portion is removed using a laser or a drill, the laser beam may irradiate and damage the electrode pad. However, as in an example, when a grinding method is used, damage to the electrode pad or the second substrate is significantly reduced and mitigated against.

The electronic device module is not limited to the examples described above, and various modifications are possible.

Figure 5:
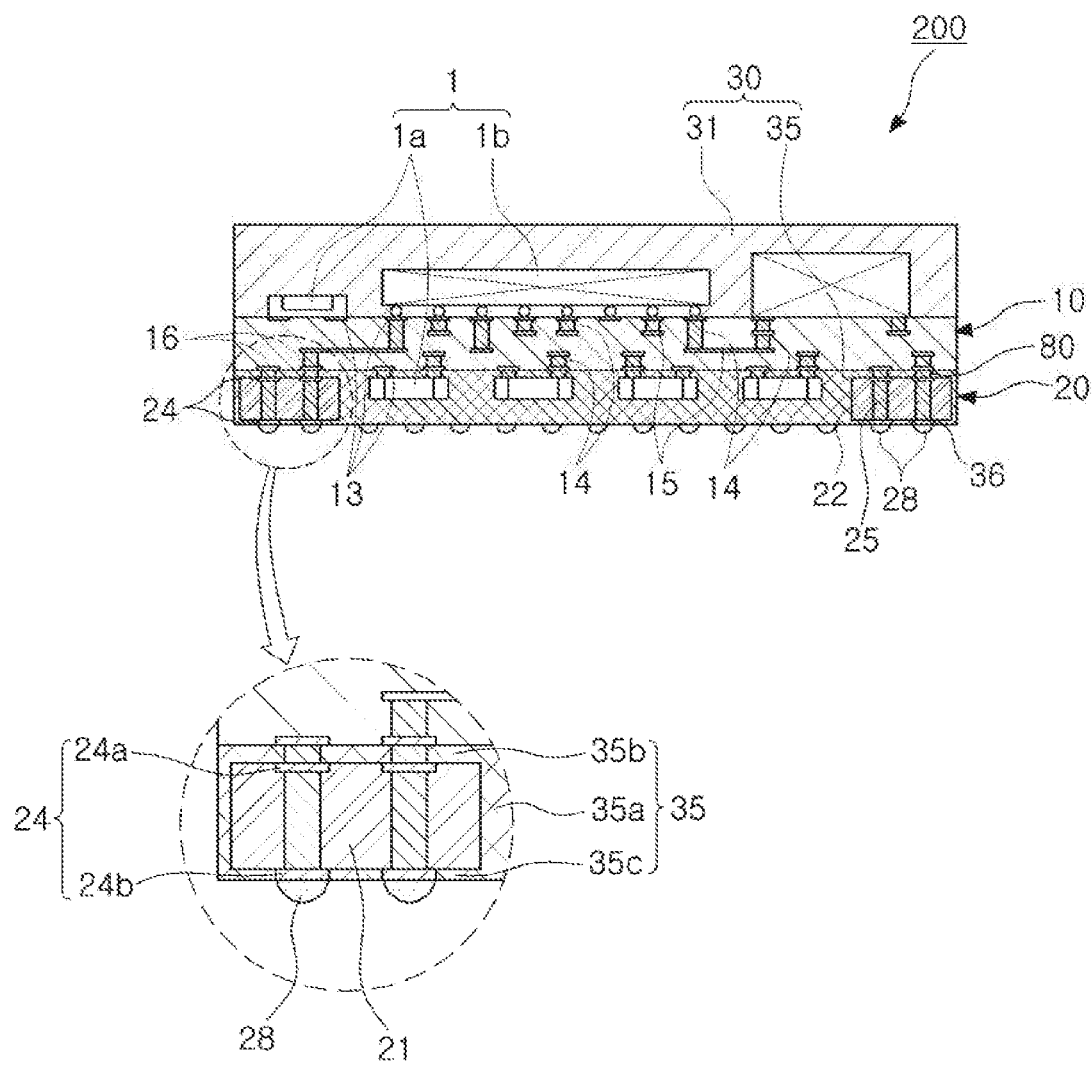
FIG. 5 is a cross-sectional view schematically illustrating another example of an electronic device module.

FIG. 5 is a cross-sectional view schematically illustrating another example of an electronic device module.

Referring to FIG. 5, an electronic device module 200 is formed by covering and sealing the entirety of the second substrate 20 using the second sealing portion 35. Thus, the second sealing portion 35 further includes a lower surface sealing portion 35c disposed on a lower surface of the second substrate 20, in addition to the device sealing portion 35a and the gap sealing portion 35b previously described.

Moreover, the second electrode pad 24b disposed in the lower surface of the second substrate 20 passes through and is externally exposed through the lower surface sealing portion 35c, and the external connection terminals 28 are mounted on the exposed portions.

To this end, the second electrode pad 24b is disposed to protrude from the insulating substrate 21 of the second substrate 20 by a predetermined distance.

Although, a case in which only the second electrode pad 24b is formed to protrude from the insulating substrate 21 is illustrated by way of example, the configuration is not limited thereto. Various modifications are possible, for example, the first electrode pad 24a may be formed to protrude in the same manner as the second electrode pad 24b.

In the electronic device module 200 configured as described above, the second substrate 20 is embedded in the second sealing portion 35, which also externally protects a lower surface of the second substrate 20.

Next, referring to FIGS. 6A through 6E, a method of manufacturing the electronic device module of the example of FIG. 5 is described.

The method of manufacturing an electronic device module is performed in the same manner as the example previously described up to an operation illustrated in FIG. 4D. Thus, a detailed description thereof will be omitted.

Figure 6A:
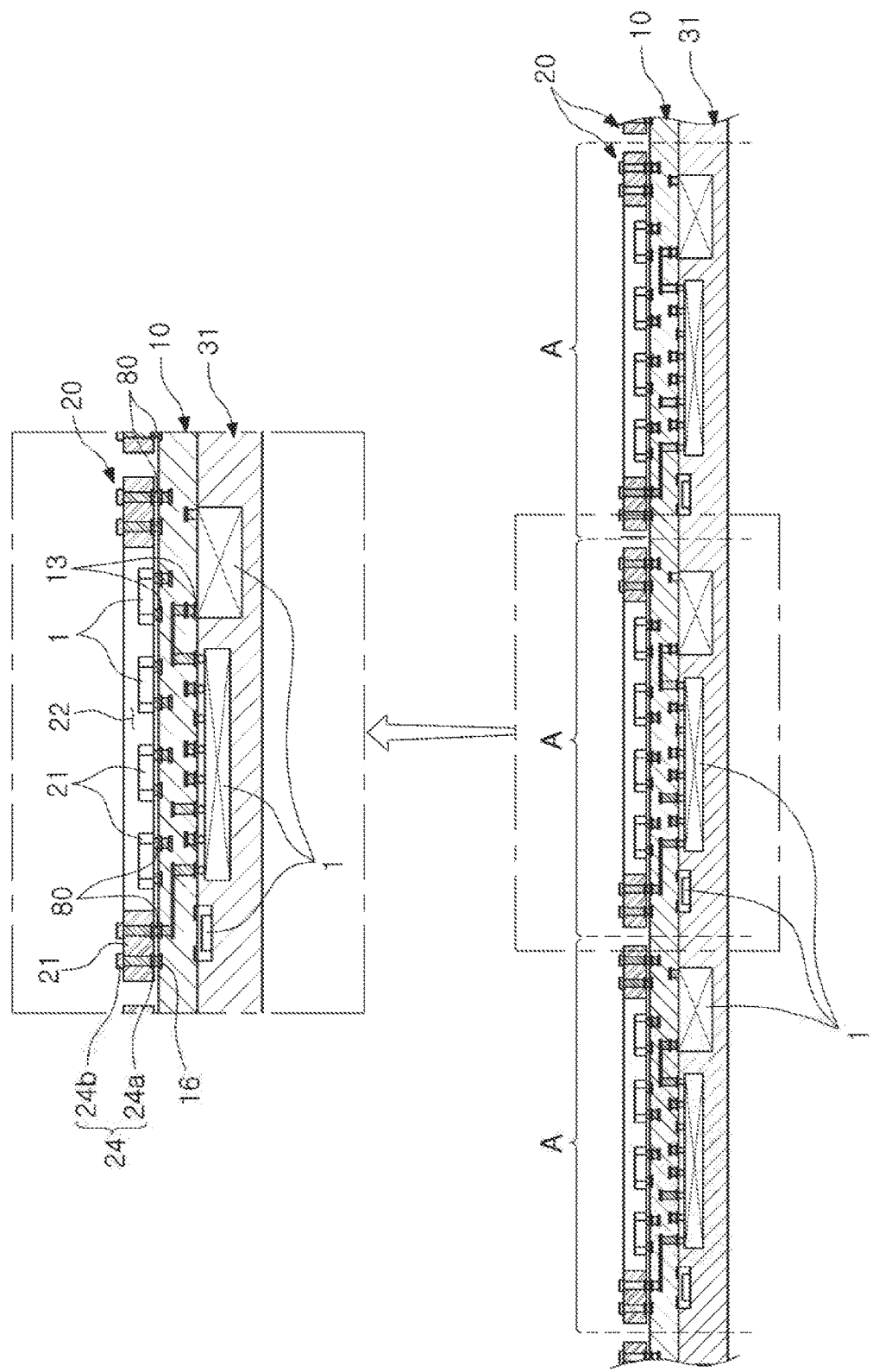

As illustrated in FIG. 4D, the printing of the solder paste P on the other surface of the first substrate 10 in which the first sealing portion 31 is formed, that is, a lower surface, is performed. Next, as illustrated in FIG. 6A, mounting of the electronic devices 1 and the second substrate 20 on the solder paste P is performed.

In an example, the second substrate 20 is formed to have the same thickness as that of the second substrate 20 of a final product illustrated in FIG. 5. On the other hand, the second electrode pad 24b is formed to be thicker than the first electrode pad 24a. Moreover, the second electrode pad 24b is formed to protrude from the insulating substrate 21 by a predetermined distance.

The second electrode pad 24b is partially removed in a grinding process which will be described later. Thus, the second electrode pad 24b is formed to have a thickness based on the portions removed in the grinding process described above.

When the electronic devices 1 and the second substrate 20 are mounted on the other surface of the first substrate 10, a solder paste is melted and cured thereafter to form the solder bonding portion 80.

Figure 6B:
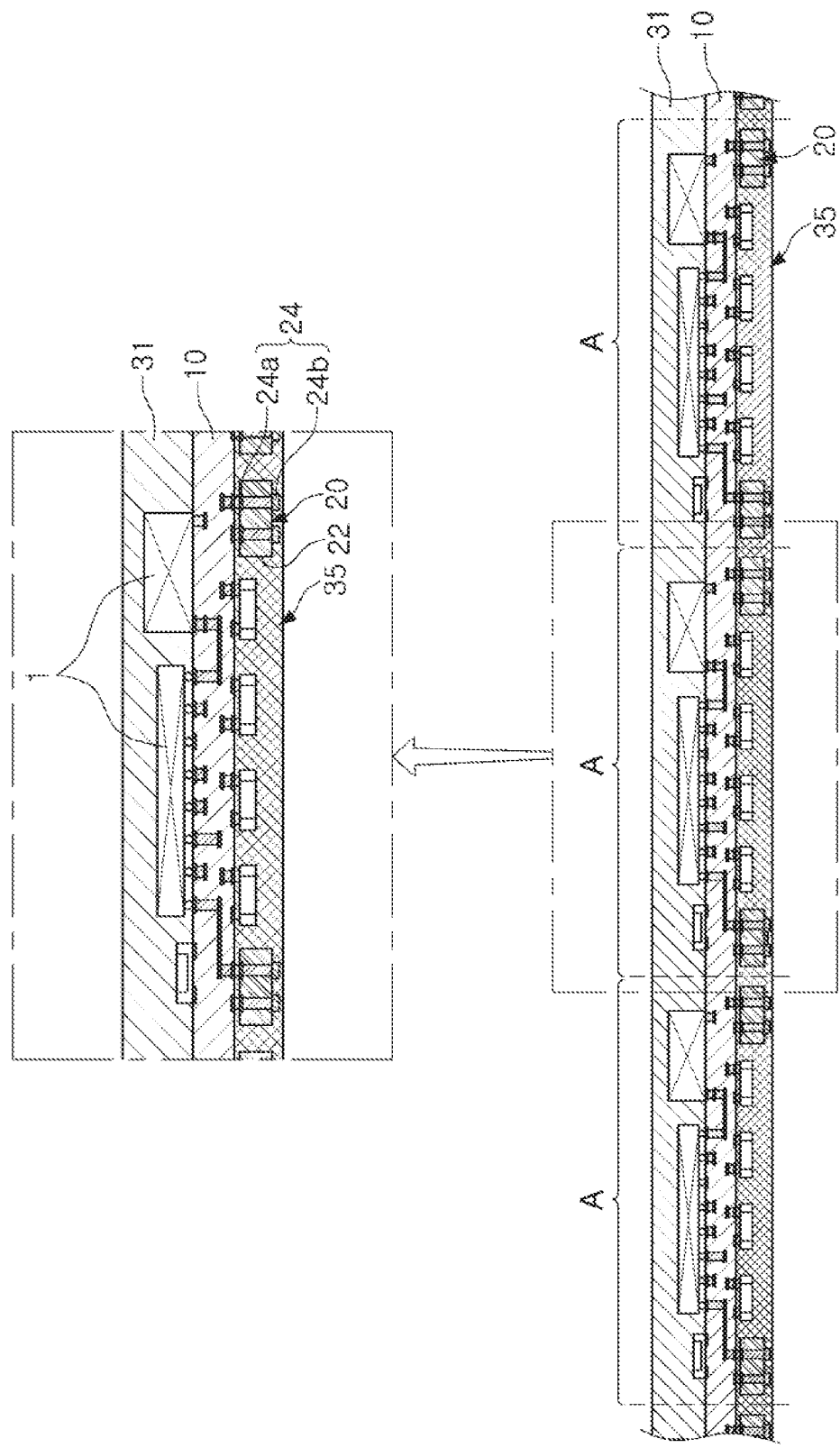

Next, as illustrated in FIG. 6B, forming of the second sealing portion 35 is performed. The second sealing portion 35 embeds the electronic devices 1 and the second substrate 20 mounted on a lower surface of the first substrate 10.

In the operation described above, the second sealing portion 35 is formed in a gap formed between the first substrate 10 and the second substrate 20, in an interior of the device accommodating portion 22, and on a lower surface of the second substrate 20.

Next, as illustrated in FIG. 6C, the second sealing portion 35 is grounded to reduce the thickness of the lower surface sealing portion 35c formed below the second substrate 20. In the operation described above, the lower surface sealing portion 35c is not completely removed, but the thickness is reduced. In addition, second electrode pads 24b disposed in a lower surface of the second substrate 20 pass through and exposed through the lower surface sealing portion 35c.

Figure 6D:
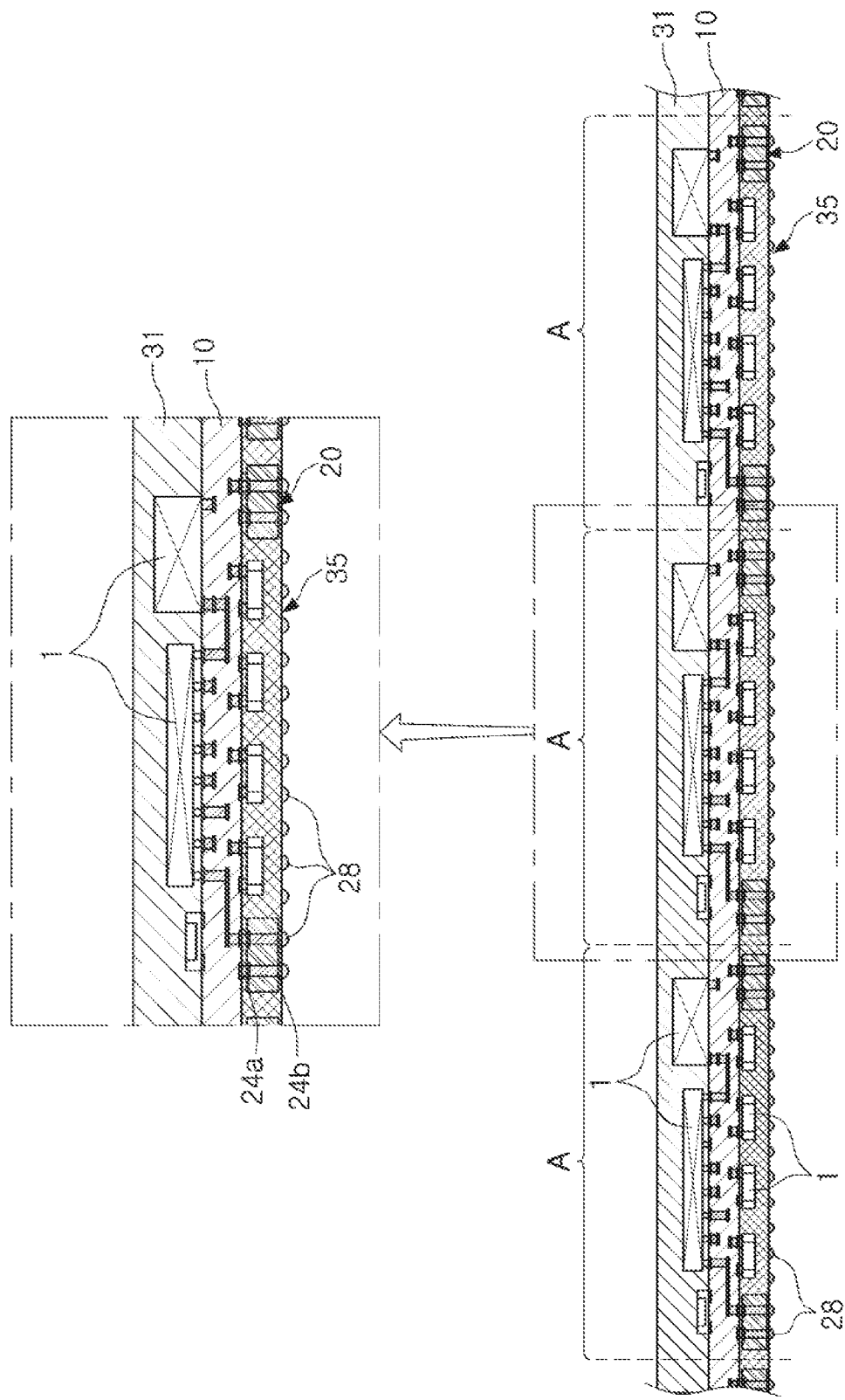

Next, as illustrated in FIG. 6D, the external connection terminals 28 are provided. The external connection terminal 28 is formed in the second electrode pad 24b exposed externally through the second sealing portion 35.

Finally, as illustrated in FIG. 6E, the first substrate 10 in which the sealing portion 30 is formed is cut so as to form the individual electronic device module 200 illustrated in FIG. 5.

In the electronic device module configured as described above, not the entirety of a lower surface of a second substrate is grounded but only partial portions of a second sealing portion and a second electrode pad.

Thus, the amount of portions removed during the grinding process is significantly reduced, which reduces the manufacturing time. In addition, a lower surface of a second substrate is not grounded, so the second substrate is prevented from being strained or being damaged during the grinding process.

As set forth above, according to examples, in an electronic device module, a molding resin fills a gap between a first substrate and a second substrate so that it is not necessary to separately inject a resin solution to fill the gap as done in the related art. It is not required to manage the amount of resin injection needed, thus simplifying the manufacturing process.

Moreover, in a method of manufacturing the electronic device module according to an example, after a second substrate is sealed, grinding is performed to externally expose an electrode pad of the second substrate. Compared to a case in which a sealing portion is removed using a laser or a drill, which results in damage to an electrode pad or a second substrate, damage is significantly reduced and mitigated against.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic device module, comprising:
a first substrate;
electronic devices mounted on the first substrate;
a second substrate coupled to a lower surface of the first substrate, the second substrate comprising a device accommodating portion;
a sealing portion configured to seal an electronic device in the device accommodating portion, and comprising a lower surface sealing portion configured to cover a lower surface of the second substrate; and
an external connection terminal bonded to an electrode pad disposed in a lower surface of the second substrate, wherein side surfaces of the electrode pad are embedded by the sealing portion,
wherein bonding surfaces of the electrode pad and the external connection terminal are disposed on a same plane as a lower surface of the lower surface sealing portion.

2. The electronic device module of claim 1, wherein the sealing portion comprises a gap sealing portion filling a gap between the first substrate and the second substrate.

3. The electronic device module of claim 1, wherein the sealing portion comprises a first sealing portion sealing the electronic devices mounted on an upper surface of the first substrate, and a second sealing portion sealing electronic devices mounted on the lower surface of the first substrate.

4. An electronic device module, comprising:
a first substrate;
electronic devices mounted on the first substrate;
a second substrate coupled to a lower surface of the first substrate, the second substrate comprising a device accommodating portion;
a sealing portion configured to seal an electronic device in the device accommodating portion; and
an external connection terminal bonded to an electrode pad disposed in a lower surface of the second substrate,
wherein bonding surfaces of the electrode pad and the external connection terminal are disposed on a same plane as a lower surface of the sealing portion,
wherein the sealing portion comprises a gap sealing portion filling a gap between the first substrate and the second substrate, and
wherein the sealing portion further comprises a lower surface sealing portion covering a lower surface of the second substrate, the electrode pad passing through the lower surface sealing portion, and the bonding surfaces being disposed on a same plane as a lower surface of the lower surface sealing portion.

5. The electronic device module of claim 1, wherein the second substrate comprises:
   an insulating substrate having an insulating layer;
   a first electrode pad and a second electrode pad disposed on opposing surfaces of the insulating substrate, respectively; and
   a conductive via passing through the insulating substrate and electrically connecting the first electrode pad to the second electrode pad.

6. The electronic device module of claim 5, wherein the second electrode pad protrudes from the insulating substrate.

7. The electronic device module of claim 5, wherein the second substrate is a printed circuit board (PCB).

8. An electronic device module, comprising:
   a first substrate having electronic devices disposed on opposing surfaces of the first substrate;
   a second substrate having an upper surface coupled to a lower surface of the first substrate, the second substrate comprising a device accommodating portion having an electronic device coupled to a first electrode pad; and
   a sealing portion configured to seal an upper surface of the first substrate, electronic devices disposed on the upper surface of the first substrate, the device accommodating portion and a lower surface of the second substrate,
   wherein a lower surface of the first electrode pad is externally exposed through the sealing portion, and
   wherein continuous portions of lower surfaces of the sealing portion disposed on the device accommodating portion and the second substrate are coplanar with the lower surface of the first electrode pad.

9. The electronic device module of claim 8, wherein the second substrate comprises:
   an insulating substrate having an insulating layer;
   the first electrode pad and a second electrode pad disposed on opposing surfaces of the insulating substrate, respectively; and
   a conductive via passing through the insulating substrate and electrically connecting the first electrode pad to the second electrode pad.

10. The electronic device module of claim 9, wherein the second electrode pad protrudes from the insulating substrate.

* * * * *